United States Patent
Thomas

(10) Patent No.: US 6,711,546 B1
(45) Date of Patent: Mar. 23, 2004

(54) UNARY CODING SCHEME FOR DIGITAL AUDIO SIGNALS

(76) Inventor: David R. Thomas, 13 Chemin du Bois d'Opio, 06650 Opio (FR)

(*) Notice: Subject to any disclaimer, the term of this patent is extended or adjusted under 35 U.S.C. 154(b) by 487 days.

(21) Appl. No.: 09/616,691

(22) Filed: Jul. 14, 2000

(30) Foreign Application Priority Data

Jul. 19, 1999 (EP) .............................................. 99401816

(51) Int. Cl.[7] .............................. G10L 19/00; H04R 9/06
(52) U.S. Cl. ......................................... 704/500; 381/332
(58) Field of Search ................................ 704/500, 501, 704/502, 503, 504; 381/338, 332

(56) References Cited

U.S. PATENT DOCUMENTS

| | | | | |
|---|---|---|---|---|
| 4,654,587 A | * | 3/1987 | Murphy | 324/103 P |
| 5,973,631 A | * | 10/1999 | McMullen et al. | 341/144 |
| 6,373,955 B1 | * | 4/2002 | Hooley | 381/335 |
| 6,403,995 B2 | * | 6/2002 | Thomas | 257/249 |

\* cited by examiner

*Primary Examiner*—Susan McFadden
(74) *Attorney, Agent, or Firm*—Bret J. Petersen; W. James Brady, III; Frederick J. Telecky, Jr.

(57) ABSTRACT

A coding scheme for digital audio signals. A method of coding a unary digital audio signal is provided for compressing a set of unary digital audio signal data comprising a succession of absolute amplitude values associated with respective sample periods of the digital audio signal, the absolute amplitude values being integers of positive or zero value, representing the number of speaker elements of a unary digital loudspeaker that are to be active in a sample period. The data is compressed by calculating the numerical difference between adjacent ones of the absolute amplitude values, thereby to convert the succession of absolute amplitude values into a corresponding succession of difference amplitude values. Each difference amplitude values is expressed as a sign bit and a plurality of data bits, representing the change in the number of speaker elements of a unary digital loudspeaker that are to be active in a given sample period relative to the immediately preceding sample period. A corresponding method of decoding the compressed signal is also provided, together with associated encoding and decoding apparatuses.

29 Claims, 10 Drawing Sheets

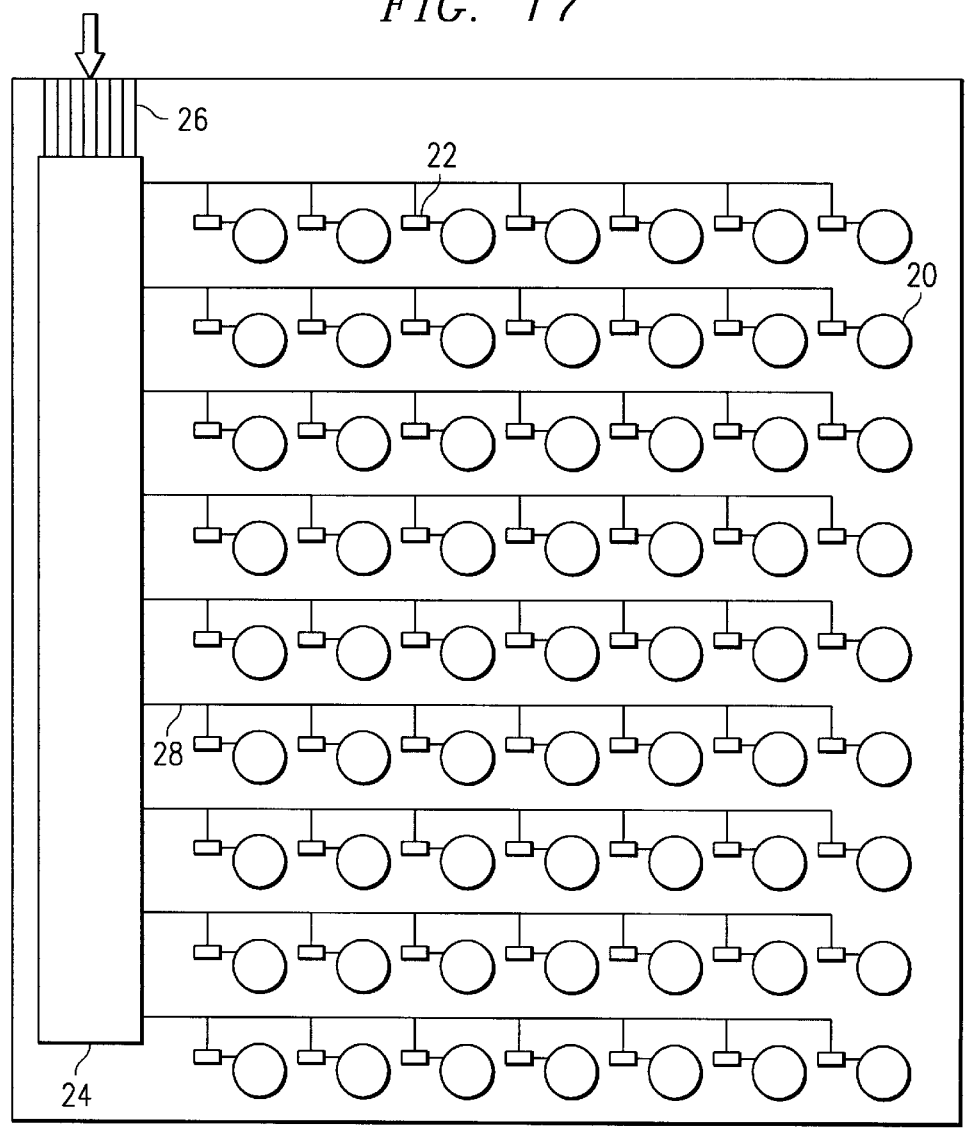

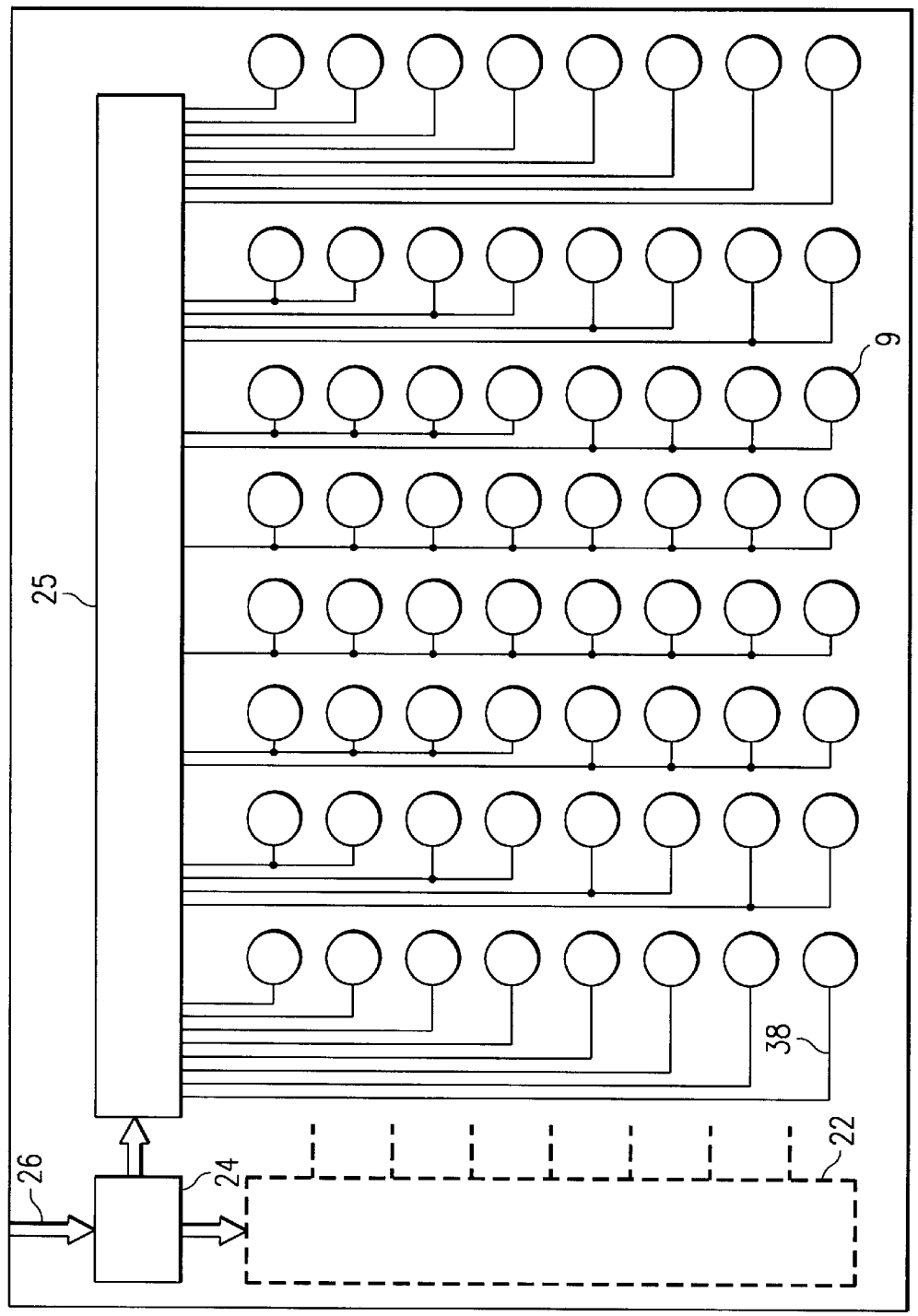

UNARY CODING SCHEME FOR DIGITAL AUDIO SIGNALS

The invention relates to a coding scheme for digital audio signals which is especially suitable for wireless transmission applications.

BACKGROUND OF THE INVENTION

Data compression techniques have been developed which reduce the bandwidth for transmission of digital audio signals. Examples of widespread conventional digital audio coding schemes are parametric coding (e.g. linear predictive coding), waveform coding (e.g. NICAM), and transform coding (e.g. MPEG-4). These techniques generally involve numerically complex decoding algorithms, especially so for techniques applicable to so-called multimedia audio, that is audio that may include music or background sounds, not only speech. To implement these known algorithms, a receiver terminal needs to be equipped with a complex decoder that increases the power consumption of the terminal.

A simple compression technique used for voice communications over a wireless link takes advantage of the fact that greater than 50% of human speech comprises silence. During the silent periods a special code is transmitted called the "silence descriptor" which serves to reduce the average power consumption of a mobile telephone unit. However, this technique is not especially useful for music, since music is generally characterised by long periods of uninterrupted sound, and hence data transmission. Multimedia audio compression techniques applicable to digital audio signals with a music content, such as MPEG-4, are generally numerically quite complex.

One multimedia audio application of interest is a handheld video terminal, for example a video telephone, a hand-held television, or a hand-held video disk player. With such a terminal, the user may wish to view a video track while listening to the music sound track. Viewing will take place by holding the terminal in front of the user at arms length. The proximity between terminal and the ear used in a pure audio terminal such as a telephone is lost. The audio may then be played through a speaker in the terminal or more likely will be transmitted to an ear piece or to headphones for private listening. In the latter case, it is likely to be impractical for commercial and other reasons to transmit the audio in conventional compressed form from the hand-held video terminal, as this would require complex decompression electronics to be housed in the ear piece or headphones.

It is therefore an aim of the invention to provide a coding scheme which allows data compression of a digital audio signal, but which is not associated with complex digital signal processing, especially at the receiver.

SUMMARY OF THE INVENTION

The coding scheme of the invention is a differential coding scheme that exploits an inherent property of unary digital coding, namely that all data elements within a unary number carry equal weight. Unary digital coding is a simple tally scheme in which the information content of each sample of a signal can be expressed merely as a positive integer or tally number.

A coding method according to one aspect of the invention is applied to a digital audio signal comprising a succession of absolute amplitude values associated with respective sample periods of the digital audio signal. The digital audio signal may be a conventional digital audio signal expressed in conventional binary format, for example in a signal which is pulse code modulated, with the amplitude value for each sample being represented by a group of "n" data bits for an n-bit digital audio signal.

Data compression is implemented by calculating the numerical difference between adjacent ones of the absolute amplitude values, thereby to convert the succession of absolute amplitude values into a corresponding succession of difference amplitude values. In the compressed digital audio signal, the difference amplitude values are expressed by a signed number of unary data bits. A sign bit is used since the difference amplitude value represents change in sound amplitude and thus may be negative or positive. In an embodiment of the invention, the difference amplitude values are represented by a sign bit and a plurality of data bits, and conveyed by a signal in which the data bits are grouped together into a single block, the width of which block varies with difference amplitude value. This may be considered to be a form of pulse width modulation in that the block width varies, although the width of each individual pulse in the signal is fixed. Unary coding of the data bits of the compressed signal allows the bit rate to be reduced in comparison to binary coding, since the data bits of each sample can be grouped together into a single block, which is thus amenable to low bit rate transmission, for example through pulse width modulation optionally in combination with a rate conversion to a fraction of the sample frequency.

Further aspects of the invention relate to a corresponding decoding method and apparatuses for implementing the coding and decoding methods, as well as loudspeaker and audio recording devices incorporating such apparatuses.

The bandwidth required for transmitting each sample of a digital audio signal in unary form can thus be reduced from the full dynamic range of the signal (e.g. $2^{16}$) to a small fraction of the dynamic range represented by the numerical difference between the tally numbers of adjacent samples in the digital audio signal. Data compression can be achieved in this way because of the strongly continuous nature of most audio signals, which results in the average numerical difference between the tally numbers of adjacent unary samples being orders of magnitude smaller than a mid-point value in the dynamic range (e.g. $2^{15}$).

The differential unary coding scheme thus takes advantage of the time-continuous properties of music, or other content-bearing audio signals, to reduce the data transmission rates without the need to apply any computationally intensive algorithms using large amounts of digital signal processing. By contrast, existing coding schemes developed for conventional digital audio, such as those mentioned further above, are based on algorithms that require considerable digital signal processing power to implement, both at the transmitter and receiver.

The differential unary coding scheme for data transmission is fully compatible with digital loudspeakers based on unary principles in that a digital audio signal coded in this way is convertible into a drive signal for a unary digital loudspeaker with very simple electronics, the invention now being further explained, by way of example only, with reference to a unary digital loudspeaker.

A unary loudspeaker comprises an array of acoustic output transducers or speaker elements, as described in PCT/GB96/00736. To reproduce a signal with n-bit digital audio quality, it will generally be necessary for $2^n-1$ or $2^{n-1}$ speaker elements to be provided. Generally, a very large number of speaker elements will be required for reasonable reproduction quality. For example, 16-bit quality will necessitate provision of something of the order of $2^{16}$ or $2^{15}$ speaker elements.

A first basic principle of a unary loudspeaker is that all of the speaker elements are identical, since all carry equal significance. Moreover, for this reason, there is no information contained in the unary signal that defines the specific speaker element that needs to be activated. Addressing in the conventional sense thus does not arise and is not required.

A second basic principle of a unary loudspeaker is that the audio output volume is dictated by the number of speaker elements that are activated at a given point in time. The greater the number of active speaker elements the greater the instantaneous amplitude of the sound pressure wave. Based on the fact that music is generally a time-continuous signal, one can assume that the sound pressure wave at any given point in time is dependent on the sound pressure wave in the previous time period. For example, the sound of a guitar comprises a fluctuation in a sound pressure wave which continues over a period of time as the string of the guitar oscillates at the resonant frequency governed by the length and mass of the string. Similarly, for wind instruments or singing, one has a dependency from one time period to the next.

If one considers a unary loudspeaker system, one defines the pressure sound wave at any given point in time by the absolute number of speaker elements that are activate in the array. In addition, the volume of the music is dependent on the number of speakers that are activated on average within the array over a time period much longer than the sampling period. Therefore, for a time continuous signal such as music, one can define the sound pressure wave at a given time to be the number of additional speaker elements, or the reduction in the number of speaker elements, that are active relative to the prior time period. The relevant time period will generally be the sampling interval. Assuming that the time period is small compared to $1/f_{max}$ (where $f_{max}$ is the maximum frequency of the music) then on average the number of bits (or unary digits) of information required to define the pressure sound wave will generally be only a few bits per time period.

With this form of differential unary coding it is therefore possible to reduce greatly the amount of information that needs to be transmitted. As a result, the complexity of the electronics required at the receiver to decode the transmitted digital audio signals can be greatly reduced in comparison with what is required with existing coding schemes. Moreover, unlike many existing coding schemes, the coding scheme is applicable regardless of the content of the digital audio signal, i.e. regardless of whether the signal content is speech or music. The coding scheme is thus applicable to so-called multimedia audio.

There are many applications where the combination of a reduced data transmission rate and simple receiver electronics is of interest.

One group of applications relates to use in a primary link between a base station and a mobile multimedia terminal, such as a mobile telephone or mobile video telephone.

Another group of applications relates to use in a secondary link between a multimedia terminal and a set of wireless headphones or wireless speakers, for example by radio transmission or infra-red.

Other cordless applications are of interest such as baby monitors and toys, for example a talking teddy bear or sound effects for a remote-controlled vehicle.

Further applications can employ wire links, such as wire connections between a multimedia terminal and conventional headphones or speakers. Still further applications may principally utilise the data compression advantage of the coding scheme. One example of such an application is for compressed data storage in a data carrier for a solid-state walkman, or other audio playing device.

BRIEF DESCRIPTION OF THE DRAWINGS

For a better understanding of the invention and to show how the same may be carried into effect reference is now made by way of example to the accompanying drawings in which:

FIG. 17 shows in plan view an integrated module of $2^6-1=63$ of the acoustic output transducers of FIG. 1 together with drive circuitry including an encoder circuit and pulse shaping circuits;

FIGS. 23A and 23B show in plan view respectively upper and lower parts of an integrated module of 8-by-8, i.e. 64, acoustic output transducers according to another unary loudspeaker design that uses alternative drive circuitry.

DETAILED DESCRIPTION

Figure 1:
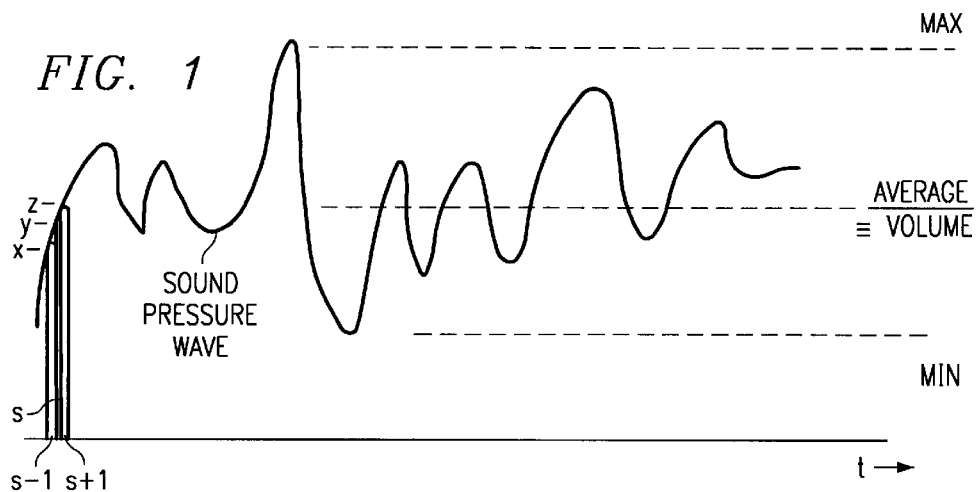
FIG. 1 shows a sound pressure wave and digital samples taken therefrom.

FIG. 1 shows an analogue audio signal representing a sound pressure wave. The pressure wave shows a variation with time between minimum and maximum amplitudes, representing minimum and maximum sound volumes over the time period illustrated. The audio signal also has an average amplitude over the time period, which represents the average sound volume. The frequency components of the audio signal are conveyed by the amplitude variation with time. A Fourier transform from the time to the frequency domain will show the relative amplitudes of the various frequency components, as is well known.

FIG. 1 also shows three samples of the analogue audio signal, samples s−1, s and s+1, associated respectively with amplitude values x, y and z. These samples are adjacent samples of the analogue signal taken to digitize the signal. The adjacent samples are separated by a time interval $\Delta t$ which is equal to the inverse of the sampling frequency $f_s$ that is $\Delta t=1/f_s$. Average volume over a time interval T containing m sample periods will thus be the sum of the amplitude values of the samples divided by the number of samples.

Figure 2:
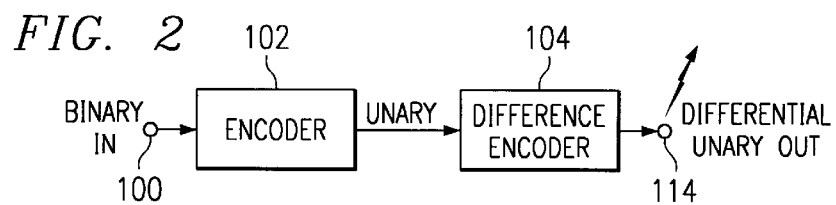
FIG. 2 shows a transmitter (coder) according to a first embodiment of the invention comprising a binary-to-unary encoder and unary difference encoder.

FIG. 2 shows a coding apparatus according to a first embodiment of the invention. The coding apparatus has an input 100 an output 114 and two intervening coding stages 102 and 104. The input 100 is for receiving a sampled digital audio signal in conventional binary digital format. The output is for transmitting the coded digital audio signal and is illustrated as a wireless transmitter, but may be some other kind of transmitter or an output for communication with any other kind of receiving device. The binary digital audio signal is supplied from the input 100 to the first coding stage which is in the form of a binary-to-unary encoder 102 which converts the binary signal into a unary signal. The binary-to-unary encoder 102 outputs a unary digital audio signal to the second stage of the coding apparatus which is in the form of a difference encoder 104. The difference encoder 104 serves to convert the unary digital audio signal into a differential unary digital audio signal in the manner described further below. The differentially encoded unary signal is then supplied to the output 114.

Figure 3A:
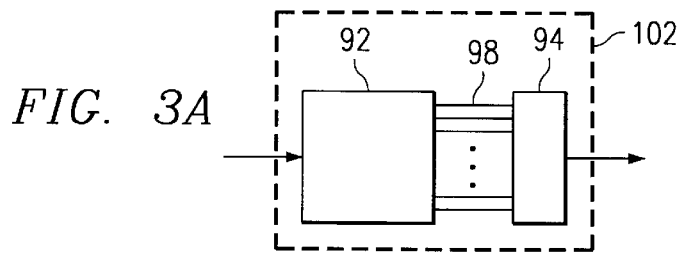
FIG. 3A shows internal structure of the binary-to-unary encoder of FIG. 2.

FIG. 3A shows the binary-to-unary encoder 102 in more detail. The encoder 102 comprises a converter 92 which is a logic gate structure for converting an n-bit binary signal conveyed on n input lines 96 (not shown individually) into a unary signal conveying the same data content on $2^{n-1}$, $2^n-1$, or some other suitable number of output lines 98. Various suitable designs for the internal logic structure of the binary-to-unary converter 92 are described in PCT/GB96/00736, to which is referred. The output lines 98 are connected to respective inputs of an output stage 94 of the encoder 102. The output stage 94 is operable to output a modulated signal representing the number of set unary bits received in the unary output lines 98. The type of modulation used in the output stage 94 can be viewed as a form of pulse width modulation, as described further below with reference to FIG. 5. However, some other kind of modulation such as pulse position modulation, pulse amplitude modulation or pulse code modulation could be used instead in the output stage.

Figure 3B:
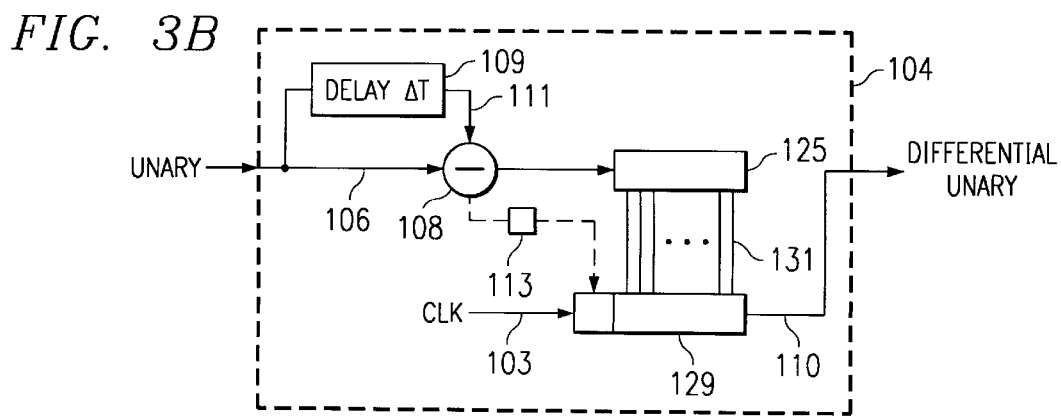
FIG. 3B shows internal structure of the unary difference encoder of FIG. 2.

FIG. 3B shows internal structure of the difference encoder 104. The incoming unary signal is made up of a sequence of groups of bits, each bit group representing one sample which in turn represents one sound pressure wave amplitude value. Further, each bit can be considered to represent one active loudspeaker element in a unary loudspeaker array over the sample period concerned. The incoming signal stream is supplied by a data path 106 to the input of a subtractor 108 and also to a delay line 121. The delay line 121 is connected at its output to a further input of the subtractor 108. The delay line 121 is configured to introduce a delay into the data path 111 equal to one sampling period $\Delta t$. As a result, when the bit group from the sample period "s" appears at the first input of the subtractor 108 from data path 106, the bit group for the immediately preceding sample period "s1" appears at the second input of the subtractor 108 after passage through the delay line 121. The subtractor 108 thus outputs a modified bit group containing a number of set data bits equal to the difference between the number of bits set in one sample period and the number of bits set in the immediately preceding sample period. (It will be understood that unset bits could be used instead of set bits for the data bits). The subtractor 108 also determines a sign bit which is set if the result of the subtraction is negative and stored in a register 113.

On the output side of the subtractor 103 there is arranged a shift register 125 into which the data bits of a bit croup are clocked. The shift register 125 is connected to a further shift register 129 so that the contents of the shift register 125 are transferred into shift resister 129 when latched by an external latch signal (not shown) which appears regularly at the sample frequency in the case of real-time conversion. The sign bit register 113 is also clocked by the same latch signal and connected so that the sign bit is loaded into the most significant bit of the further shift register 129 simultaneously with the data bits from the shift register 125. The further shift register 129 is thus loaded with a sign bit followed by a number of data bits, wherein the data bits can be considered to convey the change in the number of active unary speaker elements in comparison with the immediately preceding sample period and the sign bit can be considered to convey whether the number of active unary speaker elements has increased or decreased relative to the immediately preceding sample period. The further shift register is clocked out by a clock signal 103 having a frequency equal to the sampling frequency multiplied by the number of data bits per bit group plus one $(f_sN)+1$, thus ensuring that the full contents of the further shift register 129 is outputted each sample period to a data path 110 leading to the output 114.

In a variation the sign bit could be replaced with a sign change bit which is set whenever the sign of the result of the subtraction operation is different from the sign of the result of the previous subtraction operation. The most significant bit of the further shift register 129 will thus only be set whenever there is a turning point in the sound pressure wave which the digital audio signal is representing.

For the first sample of a data stream, there will be no value stored in the delay line for the immediately preceding sample. Consequently, the delay line 121 is initially loaded with a zero value so that the first bit group in any differential unary data stream will have the same number of set bits as in the corresponding unary bit group. Moreover, the sign bit will be set initially to ensure that an increase in the signal from its initial zero level will occur.

Figure 4:
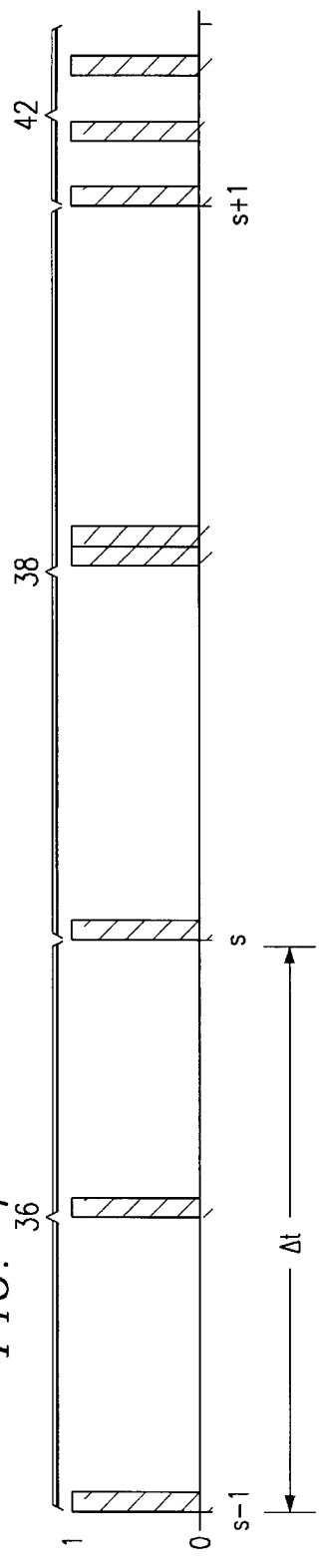
FIG. 4 shows a binary digital audio signal inputted to the binary-to-unary encoder.
Figure 5:
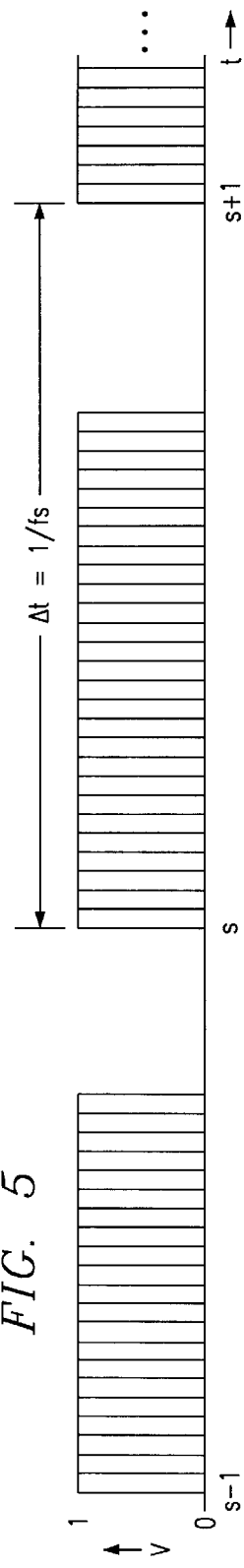
FIG. 5 shows a unary digital audio signal outputted from the binary-to-unary encoder for input into the unary difference encoder.
Figure 6:
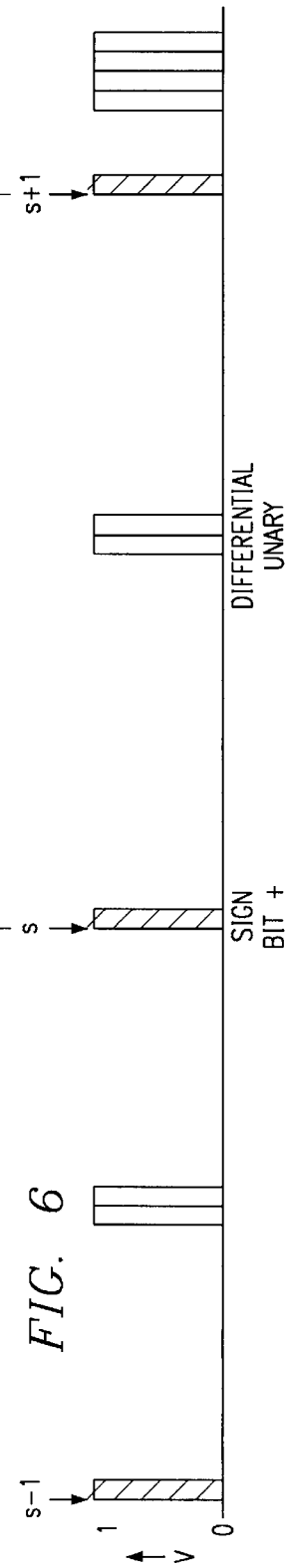
FIG. 6 shows a differential unary signal outputted from the unary difference encoder.

FIGS. 4 to 6 illustrate the modulation of three adjacent samples s−1, s and s+1 of an n-bit digital audio signal through the coding apparatus of the first embodiment. The samples are taken to be of 6-bit resolution, i.e. n=6, and have respective amplitude values x=36, y=38 and z=42. (Clearly a higher bit resolution will be required in practice, but for purposes of illustration a 6-bit example is used).

FIG. 4 shows the signal at the input 100 in the form of a conventional binary digital audio signal encoded by pulse code modulation (PCM). The samples are spaced in time by the sample period Δt as illustrated.

FIG. 5 shows the same signal after passage through the binary-to-unary encoder 102, the signal now being in the form of a unary digital audio signal encoded by a process that can be viewed as a form of pulse width modulation (PWM), although the encoding differs from the conventional meaning of that term in that individual pulses are of fixed width. Each sample period is thus subdivided into a number T of time increments, where $T=2^{n-1}=32$, $T=2^n-1=63$, or some other suitable number, of time increments. The first x, y and z of the time increments T are set in the sample periods s−1, s and s+1 respectively. More generally, it can be stated that to represent a sound amplitude corresponding to x active unary speaker elements, there will need to be x set data bits, which can all be placed in a single block or pulse owing to the unary number scheme. The width of the pulse will equal a fraction x/T of the sample period.

FIG. 6 shows the same signal again after passage through the differential unary encoder 104 in the form of a differential unary digital audio signal encoded with a sign bit of fixed width at the start of each sample period followed by a group of unary data bits encoded by PWM. In the present example, the samples are of continually increasing amplitude so that the sign bit is set in each case. (For the purpose of illustration it has been assumed that the sample s-2 has an amplitude w=34). The data bits follow the sign bit and, in the illustrated example, represent the numbers 2, 2 and 4 in the simple unary tally scheme, these numbers being the difference between the amplitude values of the samples at (s−2) & (s−1), (s−1) and s, and s & (s+1) respectively.

At this point it is noted that the binary-to-unary encoder 102 could be used on its own as a coding apparatus. That is, a coding apparatus could be provided as shown in FIG. 2, but with the difference encoder 104 omitted, thereby to convert a binary digital audio signal into a unary digital audio signal transmitted by pulse width modulation with the data bits of each sample grouped together into a single pulse having a width representing the signal amplitude of that sample. In comparison to the first embodiment, the signal structure is simplified in that no sign bit is present. However, the data compression advantages of the differential coding are not obtained. A corresponding decoding apparatus could also be provided, for example as a front end for a drive circuit of a unary loudspeaker array. Variants of this alternative embodiment could employ other forms of modulation, analogous to the first embodiment.

Although the first embodiment is described as forming a wireless transmitter, it will be understood that the differential unary signal may be transmitted in any conventional manner, for example on optical fibre or conductive wire, or written to a memory or other recording medium instead of or as well as being wireless transmitted.

In summary, the coding apparatus of the first embodiment has thus converted a PCM binary digital audio signal, first into a PWM unary digital audio signal, and then into a compressed differential PWM unary digital audio signal, where it is understood that the individual data bits are not pulse width modulated, but rather the set data bits are grouped into a single block the width of which varies according to signal content. Owing to the continuous nature of content-bearing audio signals, especially music, the change in the number of active unary speaker elements between one sample and the next will be quite small in most instances and this is what allows data compression to be effected in this way without significant degradation of perceived signal quality.

In the case of a radio frequency transmission, for example, the carrier wave is still active when no information is being transmitted. With the differential unary coding, it is thus possible to use a lower carrier frequency or a smaller frequency band.

In the case of visible or infra-red optical transmission, substantial power savings can be achieved because the average on-time per sample period for the transmitting emitter will be significantly reduced. The average number of times the emitter will be turned on and off per sample period will also be significantly reduced, which will prolong emitter component lifetimes.

In the case of data storage, the number of ones to be stored can also be significantly reduced as a result of the differential unary encoding, again reducing power consumption of memory and increasing write speed.

Figure 7:
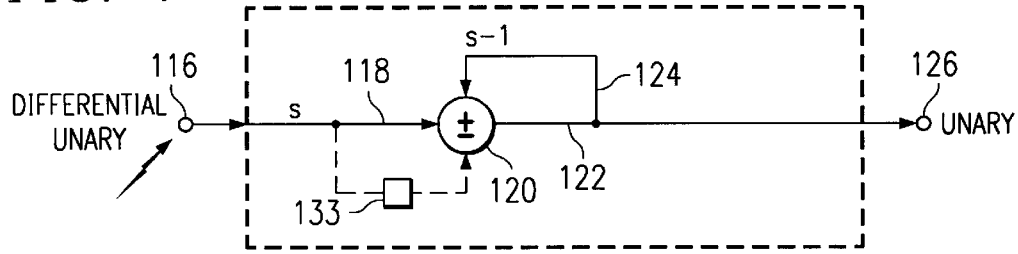
FIG. 7 shows a receiver (decoder) according to the first embodiment of the invention.

FIG. 7 shows a decoding apparatus in the form of a receiver for use in combination with the transmitter of FIG. 2. The receiver comprises an input 116 for receiving the wireless-transmitted differential unary digital audio signal. The differential unary signal is then supplied from the input 116 along a data path 118 to a differential unary decoder 128 which converts the differential unary signal back into a normal unary signal of the same form as present in the transmitter prior to the difference encoder 104. The decoded unary signal is then supplied to an output 126 for supply to a loudspeaker, further signal processing equipment, data carrier, or whatever.

Internally, the difference decoder 128 includes a logic unit 120 selectively operative as either an adder or a subtractor. One input of the logic unit 120 is connected to receive the data bits of the incoming differential unary data stream along data path 118. The logic unit 120 also has a second input connected to the data path 124 which is fed back from a data path 122 which is connected to the output of the logic unit 120. Moreover, a latch 133 is provided for receiving the sign bit of each sample and supplying to a third input of the logic unit 120. This data path is shown with a dashed line in FIG. 7. The logic unit 120 is operative responsive to the input received at its third input, acting as an adder in the case that the sign bit is set to indicate a positive change to the number of unary data bits, or as a subtractor in the case that the sign bit is unset to indicate a negative change to the number of unary data bits in relation to the preceding sample. When operative as a subtractor, the logic unit 120 subtracts the number of data bits received from the data path 118 from that received from the data path 124.

Thus, in operation, when the difference value for a sample period "s" appears at the first input of the logic unit 120, the absolute number of unary bits for the immediately preceding sample period "s−1" appears at the other input of the adder 120. The adder thus reconstitutes the number of unary bits for the sample "s" by adding or subtracting the number of data bits in the differential unary signal for that period to or from the number of unary bits reconstituted in the immediately preceding sampling period of the decoder. It will be understood that no delay line is shown in the difference decoder (unlike the difference encoder of the coding apparatus) since the logic unit 120 is clocked with the sample period. The equivalent delay to that present in the transmitter is thus achieved in the receiver merely by a latched output register in the logic unit 120.

Analogous to the transmitter, the output register of the logic unit 120 is initialised with a zero value and the sign bit in the latch 133 is set. This may be achieved internally by the receiver or by padding each transmission with a sample signal having a set sign bit followed by no set data bits. As a result of the initialisation, the data bits of the first sample will pass through the logic unit 120 unchanged. When the second sample appears at the logic unit from data path 118, the signal expressing the number of bits in the first sample will have fed back to the second input of the adder 120 through data path 124, and so forth to decode the incoming data stream.

Figure 8:
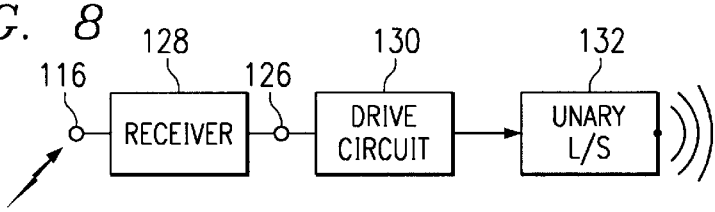
FIG. 8 shows an audio reproduction system incorporating the receiver of FIG. 7.

FIG. 8 shows an audio reproduction system incorporating a receiver as described with reference to FIG. 2 comprising the input 116 and receiver 128. The output 126 of the receiver 128 is connected to a loudspeaker drive circuit 130 which outputs drive signals with appropriate electrical characteristics to a unary loudspeaker 132. Designs for the drive circuit 130 and unary loudspeaker 132 can be found further below in the description of FIG. 16 to FIG. 23, and also in PCT/GB96/00736.

Figure 9:
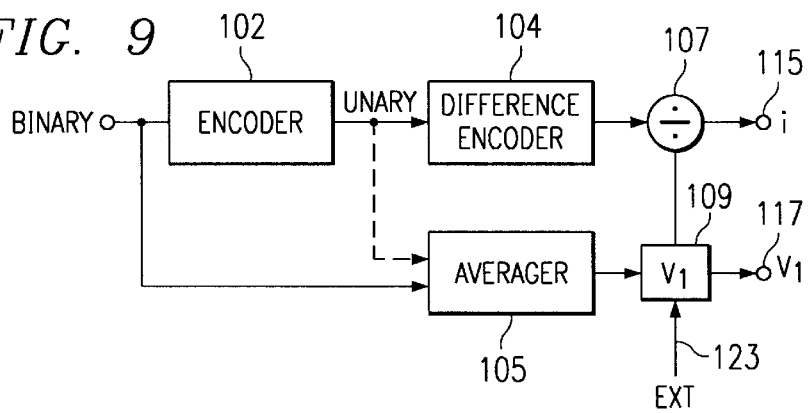
FIG. 9 shows a transmitter (coder) according to a second embodiment of the invention.

FIG. 9 shows a coding apparatus according to a second embodiment of the invention in the form of a wireless transmitter. In this embodiment, the differential coding scheme is further developed to provide a greater amount of data compression than in the first embodiment. This is achieved by dividing the audio information contained in the digital audio signal into a volume component and an incremental component. The volume component may be defined computationally from the data stream itself, or may be defined by an external input, or a combination of both.

The transmitter of the second embodiment comprises an input 100 for receiving a binary digital audio signal, a binary-to-unary encoder 102, and a difference encoder 104 all arranged and internally constructed in the same way as in the coding apparatus of the first embodiment.

The coding apparatus of the second embodiment differs from that of the first embodiment in respect of the additional components provided for setting the volume increment. A register 109 is provided for storing the volume increment. The volume value may be set by an external input 123, or be derived from the digital audio signal itself. To implement the latter arrangement, a computational unit 105 is provided for computing an average value for the number of active bits in each sample period over a larger number of sampling periods. The computational unit 105 is shown connected to receive the binary digital audio signal through a data path 101 branched off from the main data path leading from the input 100 to the binary-to-unary encoder 102. Alternatively, the computational unit could be connected to receive the unary digital audio signal, as illustrated in FIG. 4 with a dashed line.

The computational unit 105 is arranged to sum the number of bits contained in a series of samples over a time period encompassing a very large number of sample periods, the averaging period being referred to as the volume interval in the following since the average value over a long period is perceived by a listener of an audio signal reproduced on the basis of the signal as the volume level. At the end of each volume interval, the average value $v_1$ is computed by the computational unit 105 and supplied to an output 117 which leads to a wireless transmitter, and also to the register 109 where the value is held internally. The register 109 is latched to an input of a divider 107, the other input of which receives the output from the difference encoder 104. The divider 107 is connected to divide the amplitude value of the differential unary signal received from the difference encoder 104 by the volume value $v_1$ held in the register 109. The output of the divider 107 is supplied to an output 115 which leads to the wireless transmitter. The transmitted amplitude value "i" is thus in differential unary form but reduced to a fraction of $1/v_1$ of the differential unary value output from the difference encoder 104. The sign bit passes through the divider 104 unchanged. A volume control may instead, or additionally, be placed on the receiver, as is described further below with reference to FIG. 11. Depending on the application, it may be desirable to omit one of the volume setting means altogether, i.e. omit the computational unit 105 and interconnecting data paths, or omit the external input 123.

For the initial volume interval over which no average value will yet have been computed, the register 109 is loaded with a value $v_1=1$ so that the divider 107 performs a division by one, i.e. has no effect, on the number of bits of the differential unary signal. The additional data compression contribution of the coding scheme of the second embodiment thus first becomes operative at the start of the second volume interval.

The volume interval will typically be set for a whole audio track by the external line 123, or by averaging over time intervals including a large number of samples, for example over a time interval of the order of a second (e.g. between 0.1 seconds and 2 seconds) which may be expected to contain a segment of music or other audio of approximately constant volume for the majority of such intervals. The volume interval in seconds will be equal to the number of sample periods within the volume interval divided by the maximum sampling frequency.

In summary, a high degree of data compression takes place with this coding scheme, since the increment values "i" are generally smaller by a factor $v_1$ than the amplitude values output from the difference encoder 104. It will also be understood that the divider 107 is an integer divider so that the remainder is truncated as a result of the division, potentially resulting in an undesirable degree of loss of signal definition if the volume value is set too high.

Figure 10:
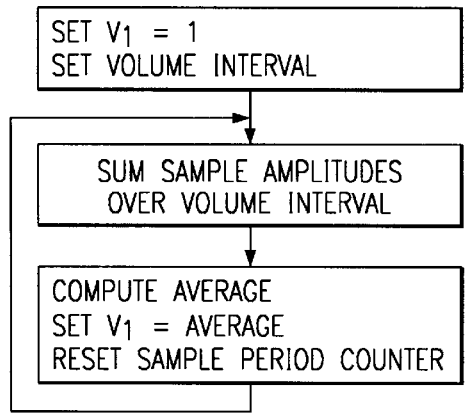
FIG. 10 is a flow diagram showing operation of the transmitter of FIG. 9.
Figure 11:
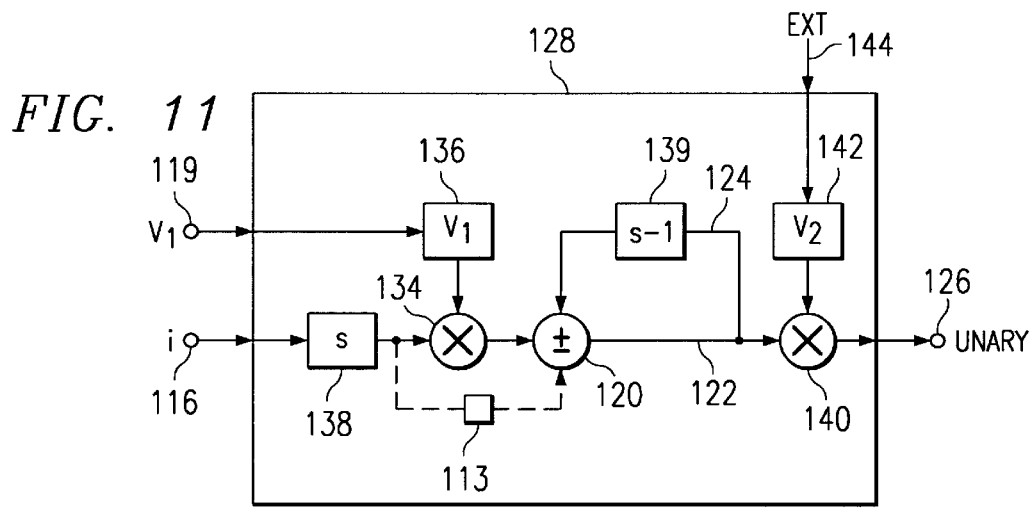
FIG. 11 shows a receiver (decoder) according to the second embodiment of the invention.

FIG. 10 is a flow diagram showing the operation of the computational unit 105. During idle, pending receipt of an input digital audio signal, the register 109 is loaded with the volume value $v_1=1$ and the volume interval is set to a desired default length in terms of an integer number "m" of sample periods. On receipt of an input digital audio signal, the number of bits contained in successive sample periods are summed over 1 to m sample periods. At the end of the sample period when the sample number reaches m, the sum is divided by m to compute the average value of the bit number over the volume interval. This average value $v_1$ is then output to the register 109 and the wireless transmission output 117 for transmission. The sample period counter is then reset to 1 to indicate the start of a new volume interval, whereupon the summing of the bit numbers re-commences as a precursor to computation of a new FIG. 11 shows a decoding apparatus according to a second embodiment for use with the coding apparatus of FIG. 9. The decoding apparatus is illustrated as being a receiver and comprises a differential decoder 128 for converting the differentially coded input data into a normal unary digital audio signal at the output. The receiver routes the incoming signal to two internal inputs 119 and 116, respectively for the volume and incremental components of the encoded signal. The volume component of the encoded signal contains the average volume value $v_1$. This value is conveyed from the input 119 into a register 136 in the difference decoder 128. The increment part of the transmitted signal contains the reduced differential unary signal and is supplied along a data path to a latch 138 and then onto an input of a multiplier 134. A further input of the multiplier 134 is connected to receive the value held in the register 136. The multiplier 134 is thus operable to output a differential unary value corresponding to the value supplied to the divider 107 in the transmitter of FIG. 4.

The signal output from the multiplier 134 is conveyed through a data path to a first input of a logic unit 120 which has a second input connected to the output of the logic unit 120 through a feedback data path 124 in which is arranged a latch 139. A latch 113 is also provided for receiving the sign bit from the increment signal component and supplying it to a third input of the logic unit 120. The logic unit 120 is selectively operable as either an adder or subtractor responsive to the input received at its third input, as will be understood with reference to the first embodiment.

The logic unit 120 is thus operative to add or subtract, as appropriate, the difference value from the multiplier 134 to the absolute amplitude value reconstituted for the preceding sampling period. The signal output from the logic unit 120 on data path 122 is thus already the decoded unary digital audio signal corresponding to the signal received by the difference encoder 104 of the transmitter.

The latches 138 and 139, which have no analogue in the first embodiment, provide additional functionality which is now described. The latch 138 holds the reduced number of data bits of the differential unary signal, presenting those bits to the first input of the multiplier 134. In the case that there is an interruption in the transmission of the signal so that the increment for the next sampling period is not received at the input 116, then the increment value for the last sampling period continues to be presented to the first input of the multiplier 134. The multiplier 134 thus outputs the same value as for the previous sampling period to the logic unit 120. In turn, the logic unit 120 adds or subtracts this increment to the absolute amplitude value computed for the preceding sampling period which is still presented to the second input of the logic unit 120 by the latch 139 arranged in the feedback data path 124 from the output of the logic unit 120. The sign bit value is also latched and thus presented to the third input of the logic unit 120 despite the absence of a fresh sample. In this way, a simple linear interpolation of the bit numbers of the unary signal is made in the absence of a new increment for a subsequent sampling period. When the transmission is re-established, a small instantaneous error in the desired pressure sound-wave will appear as a small permanent increase or decrease in volume. Since human perception detects absolute volumes on a logarithmic scale, the error would be practically undetectable after transmission has resumed.

It will be understood that a similar forward error correction functionality could be provided in the receiver of the first embodiment by provision of a latch, analogous to the latch 138, in the data path 118 and a further latch, analogous to the latch 139, in the data path 124.

FIG. 11 also shows further components for local control of the volume at the receiver. These components comprise a multiplier 140 having an input connected to the data path 122 and a further input for receiving a volume multiplier $v_2$ from a register 142 which holds that value. The value held in the register 142 is externally controllable by a data path 144, for example by a tuning knob or buttons. The multiplier 140 has an output which is connected to an output 126 of the difference decoder 128. The optional local volume control is a convenient addition, but it will be understood that it does not affect the data compression aspects of the coding.

To summarise the coding scheme of the second embodiment, the data rate for transmission per sampling period is further reduced over the coding scheme of the first embodiment in that the information to be transmitted is sub-divided into a volume component and an incremental component. Since the volume component can be fixed for a given transmission, or at least for long periods within the transmission, the volume information only needs to be transmitted once, or at long intervals. Subsequently, the pressure sound-wave is dependent on the value of the prior sampling period plus or minus the incremental component multiplied by the volume.

Figure 12:
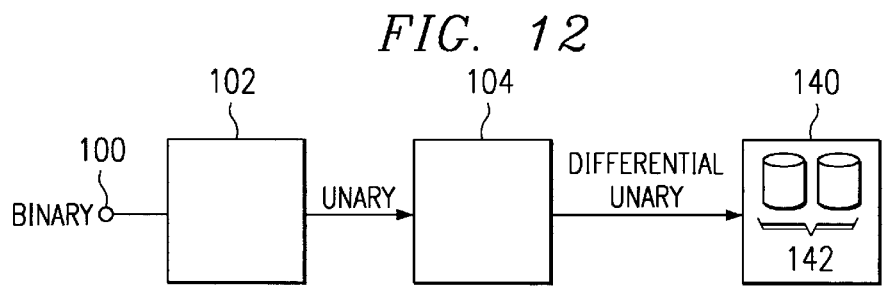
FIG. 12 shows a recording device according to a third embodiment of the invention for recording a compressed digital audio signal on a data carrier.

FIG. 12 shows a recording device according to a third embodiment of the invention. The recording device comprises an input 100 for receiving a conventional binary digital audio signal connected to a binary-to-unary encoder 102, which is in turn connected to a difference encoder 104. These components can be the same as those of the first or second embodiments as desired. The output from the difference encoder 104 is then written to a data carrier 140. The data carrier 140 has stored thereon one or more data files 142 in which the digital audio data is stored in compressed form.

Figure 13:
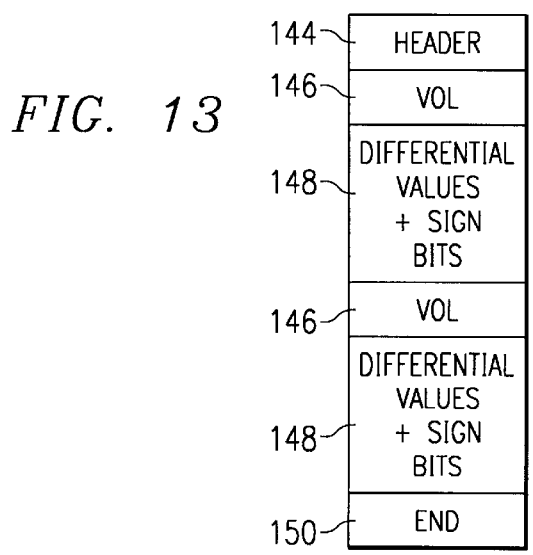
FIG. 13 shows a file format in which data is stored on the data carrier of FIG. 12.

FIG. 13 shows the file format of a digital audio product stored on the data carrier of FIG. 12. The file format shown is compatible with an encoding scheme according to the second embodiment in which the signal comprises separate volume and increment components. The file comprises a header 144 including a track identifier. The data content of the file is then made up of any desired number of sets of differential samples 148, each containing the sign bit and data bits. The sign and data bits of the samples are stored with associated volume values 146 which represents the scaling factor for the reduced differential number of bits for each sample in the coding scheme of the second embodiment. The differential bit number values may be stored on the data carrier in unary, or any other number format. The file then terminates with an end marker 150.

If instead the coding scheme of the first embodiment is used, it will be understood that the volume values 146 will be omitted, so that the file format will merely comprise a header 144 followed by a stream of differential bit number values 148.

Figure 14:
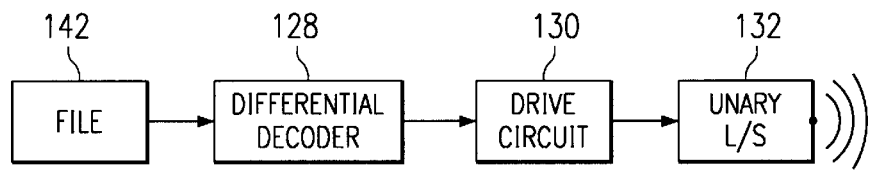
FIG. 14 shows a reproduction device for reading and playing a compressed data file from the data carrier of the third embodiment.

FIG. 14 shows an audio player and loudspeaker system for reproducing audio products stored on a data carrier as described above with reference to FIG. 12 and FIG. 13. The audio player of FIG. 14 comprises a difference decoder 128 according to the first or second embodiment arranged to read a digital audio product file stored on a data carrier, as described above. The output from the difference decoder 128 is then supplied to a unary drive circuit 130 for driving a unary loudspeaker 132. The drive circuit may be part of the audio player or the loudspeaker, or may be split between these two devices, as desired.

Figure 15:
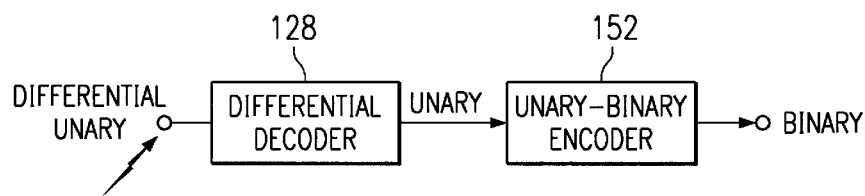
FIG. 15 shows a receiver according to a fourth embodiment of the invention which uses differential unary data compression coding, but which is compatible with conventional binary digital audio signal reproduction components.

FIG. 15 shows a receiver according to a fourth embodiment of the invention. In this embodiment, a difference decoder 128 according to the first or second embodiment is provided. The output from this difference decoder is then supplied to a unary to binary encoder 152 which outputs a conventional binary digital audio signal. It will thus be understood that the coding scheme proposed herein is not limited to audio reproduction or storage in unary digital form, but can be utilised purely for compressed transmission of data which is manipulated both at the transmitter and receiver ends in binary form. The respective unary components at the transmitter and receiver would thus be confined to respective output and input stages thereof.

DETAILED DESCRIPTION OF SUITABLE UNARY LOUDSPEAKERS

The following description of FIG. 16 to FIG. 23 is taken from co-pending European patent application number 99401288.8 entitled Digital Loudspeaker and filed on May 28, 1999, the contents of which are incorporated herein by reference. The applicants reserve the right to cancel FIG. 16 to FIG. 23 and the following description thereof after publication of European patent application number 99401288.8, and insert in place of the cancelled figures and text a simple cross-reference to the published application.

Figure 16:
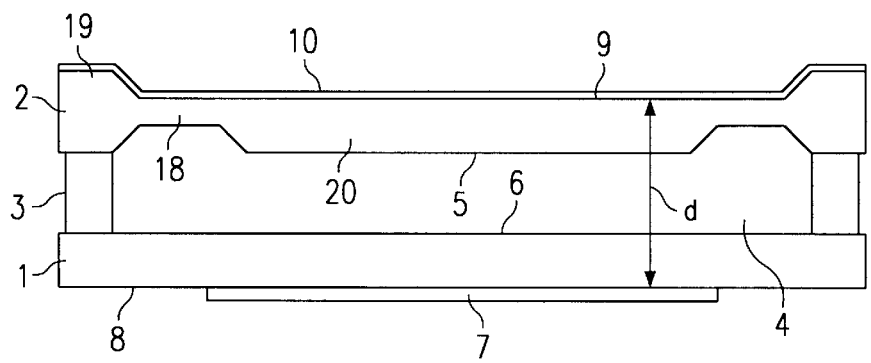
FIG. 16 shows in section an acoustic output transducer used in a unary loudspeaker.

FIG. 16 shows in section a single acoustic output transducer of a unary loudspeaker suitable for use in an audio reproduction system according to any of the above-described embodiments of the invention.

Referring to FIG. 16, each transducer comprises a lower panel 1 and a upper panel 2. The panels 1 and 2 are arranged parallel to each other and spaced apart by insulating material 3 with a separating gap 4 being formed between a lower side 5 of the upper panel and an upper side 6 of the lower panel. The panels 1 and 2 are based on silicon wafers and the insulating material is a polymer insulator arranged in pillars extending between the panels. In other embodiments, the insulating material 3 could be formed from the material of the upper or lower panels. Manufacture of an integrated transducer array based on transducers according to the transducer of FIG. 16 is described in more detail further below.

The lower panel 1 has a conductive layer 7 in the form of a metal layer, for example metal or highly-doped semiconductor, arranged on an lower side 8 thereof. The upper panel 2 has a conductive layer 9 in the form of a metal layer or a layer of highly-doped semiconductor, arranged on an upper side 10 thereof. The conductive layers 7 and 9 are positioned a distance 'd' apart and, for the loudspeaker drive circuit described further below, form first and second plates of a parallel plate capacitor. The conductive layers 7 and 9 are provided with respective tracks (not shown) via which a drive signal is applied to the transducer in use. The tracks may for example be of standard suicides or metal such as gold, aluminum or copper.

The upper panel 2, at each transducer, has a waisted bridge portion 18 interconnecting a thicker peripheral portion 19 and a thicker central diaphragm portion 20. The waisted bridge portion 18 is sufficiently thin that the diaphragm portion 20 is resiliently supported relative to the peripheral portion 19. In the present embodiment, the diaphragm portions 20 of the module are circular, the resilient support portions 18 are ring-shaped and the peripheral portions occupy a square area. However, it will be understood that the shape of the diaphragm portions may be varied and is not fundamental to performance of the transducer elements. For example, oval, square or rectangular diaphragms could be used instead of circular ones.

In use, application of a drive signal to the conductive layers 7 and 9 will generate electrostatic forces of attraction (and repulsion) between the lower panel 1 and upper panel 2 to which the conductive layers 7 and 9 are adhered. The effect of the electrostatic forces is to move the diaphragm portion 20 of the upper panel 2 relative to the lower panel 1, through deformation of the resilient support portion 18.

The electrostatic attractive force $F_x$ induced between the conductive layers 7 and 9 by the drive signal is given by $F_x = -\frac{1}{2}\epsilon(V^2/d^2)A$. The parameter $\epsilon$ is the dielectric permittivity, which will be a compound value taking account of the fact that the gap 'd' will generally be part air or vacuum, and part silicon or other wafer material. The parameter V is the applied voltage of the drive signal which will be a function of time V(t), typically in the form of drive pulses. The parameter A is the effective area of the parallel plate capacitor formed by the conductive films. The relevant area for the equation of motion for the diaphragm will be the movable area of the transducer, i.e. the area of the diaphragm portion 20.

The transducer can be viewed as a forced harmonic oscillator in which the applied drive force is that induced electrostatically by the drive signal V(t). The resilient support portion 18 provides a restoring force with a spring constant 'k', the value of which will depend on its dimensions and mechanical properties. The equation of motion (with no damping term) for the transducer is then:

$$md^2x/dt^2 + kx = F_x - \tfrac{1}{2}\epsilon(V(t)^2/d^2)A.$$

A damping term (b dx/dt) can be added to the left-hand side of the above equation if appropriate, for example to take account of air viscosity. Conventional diaphragm modelling techniques can then be applied to calculate what shape of drive pulse will produce a linear, or more approximately linear, response of the diaphragm portion 20. For this purpose, a pulse shaping circuit may be included, as is described further below.

To manufacture an integrated module of multiple transducers, two silicon wafers are taken as a starting point, one for the lower panel 1 and another for the upper panel 2. The silicon wafers may, for example, be 5 inch diameter wafers (5 inches amounts to approximately 12.5 cm) having a thickness of 625 micrometers. Any other industry-standard diameter could conveniently be used.

To manufacture the upper panel 2, a wafer is etched from the upper side 10 to thin over a circular area which will form the upper side of the resilient support and diaphragm portions 18 and 20 of each transducer. The wafer is then etched from the lower side 5 over a ring area to form a thinned bridge for the resilient support portion 18. The thickness in section of the resilient support portion 18 may be chosen to provide any desired characteristic spring constant. For example, the thickness may be in the range 5 to 100 micrometers, or beyond. One specific value is 20 micrometers. The thickness chosen will depend on the mass, and thus inertia, of the diaphragm portion 20. The thickness chosen will also depend on the radial dimension of the resilient support portion 20. The diaphragm portion 20 will generally be thicker than the resilient support portion 18, but this is not necessarily the case. The thickness of the diaphragm portion 18 will be relevant for the definition of the mass 'm' of the moving part of the transducer in the above equation of motion. One specific value for the thickness of the diaphragm portion is 300 micrometers. After etching, masking nitride and oxide layers are removed and the wafer can be metallised on its upper side 10 to form the conductive layer 9. A protective coating of PECVD nitride is then added (not shown).

To manufacture the lower panel 1, conductive layer 7 is applied to one side of a wafer by metallisation and a PECVD nitride layer (not shown) is added. Polymer insulator posts 3 are then applied by deposition and patterning to the other side of the wafer. The deposition and patterning can use photo-imageable polyimide. The posts may be from 10 micrometers to 50 micrometers in height, or higher, for example between 50 and 500 micrometers in height. The height of the posts is preferably chosen so that, in the finished device, the lower side 5 of the diaphragm portion of the upper panel can physically contact the upper side 6 of the lower panel 1 without fracture or permanent damage to the resilient support portion 18 which deforms responsive to the drive signal. In this way, the transducer has some inherent protection against being overdriven.

The lower panel 1 and upper panel 2 are then joined together using standard alignment and bonding procedures.

With the arrangement of the conductive layers 7 and 9 in the present embodiment, the first and second conductive layers remain spaced apart even if the diaphragm portion of a transducer is brought into physical contact with the lower panel by overdriving. This ensures that no electrical short can occur across the plates of the capacitor as a result of such contact.

This function can be achieved with a number of arrangements of the conductive layers, not just that of the present embodiment. For example, it is achieved if the first conductive layer 7 is formed in or under the lower panel 1 remote from the upper side 6 of the lower panel facing the upper panel 2. It is also achieved if the second conductive layer 9 is formed in or on the upper panel 2 remote from the underside 5 of the diaphragm portion 20 facing the lower panel 1.

In the present embodiment, the above-described transducer is part of a transducer array formed as an integrated module.

Figure 18:
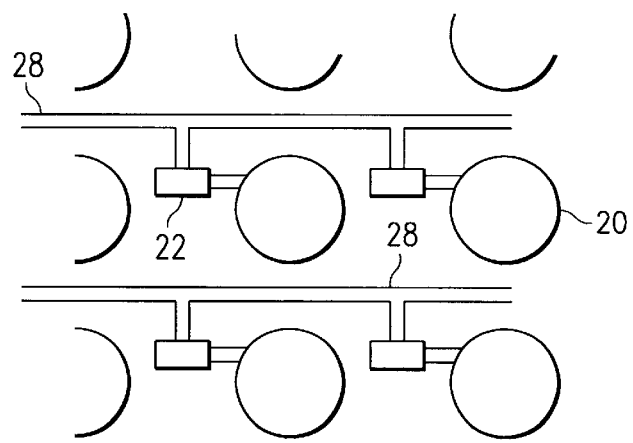
FIG. 18 shows a portion of the module of FIG. 17 in more detail.

FIG. 17 and FIG. 18 show in plan view an integrated module comprising a 9-by-7 array of $2^6-1=63$ transducers. Each transducer has a square footprint with a centrally-arranged circular diaphragm, the array being formed as a square grid.

Adjacent the diaphragm 20 of each transducer, there is provided drive circuitry in the form of a pulse shaping circuit 22. The pulse shaping circuit 22 is designed, having regard to a non-linear response function for the diaphragm computed from the above equation of motion, so that a standard square-shaped input pulse received by the pulse shaping circuit is transformed into a non-square pulse shape that at least partially compensates for the non-linear diaphragm response, thereby to produce an acceptably uniform acoustic pulse output pressure.

For example, if the resilient portion is shaped and dimensioned to provide a relatively large spring constant 'k', then restoring forces will dominate the diaphragm response in which case the pulse shaping circuit 22 can be designed to provide a ramp at the start of each drive pulse.

On the other hand, if the diaphragm portion 20 is made relatively large in comparison with the resilient support portion 18, then inertial forces may dominate the diaphragm response in which case sharp pulses can be inserted at the beginning and end of each drive pulse to initiate and arrest diaphragm motion.

Pulse shaping considerations in both these instances are described more fully in PCT/GB96/00736.

Whether restoring forces or inertial forces dominate, non-linear contributions from the variance of the gap 'd' may also be significant and require compensation by pulse shaping. Moreover, the diaphragm response may be further varied by provision of a viscous medium, such as a liquid or gas, in the space between the diaphragm and lower panels 1 and 2, thereby providing a further design parameter.

The module's pulse shaping circuits 22 are formed in the peripheral portions 19 of the silicon upper panel 2 of each transducer as integrated circuits, using standard photolithographic patterning techniques. Alternatively, the pulse shaping circuits and other drive circuitry could be formed in the lower panel 1 in another embodiment.

Nine groups 28 of seven tracks form the 63 unary outputs of the encoder circuit 24, each group 28 extending to supply the transducers of one of the nine rows of the transducer array. Each track terminates in a spur contacting to the input of one of the pulse shaping circuits 22.

In an alternative embodiment, there is provided one pulse shaping circuit for each row or pairs of rows of transducers, with the drive pulses for each row all being routed through the associated pulse shaping circuit. In this case, the pulse shaping circuit output could be connected to all of the transducers of its row or pair of rows. A column selector circuit would then be arranged to selectively connect the output of each pulse shaping circuit to any one of the associated transducers, responsive to an input to the selector circuit supplied by the encoder circuit. There would thus be an addressing scheme somewhat similar to that used in displays or CCD detectors.

Returning to FIG. 17, to one side of the transducer array there is provided further drive circuitry in the form of a binary-to-unary encoder circuit 24. The encoder circuit 24 is formed as an integrated circuit in a lateral extension of the silicon upper panel 2 using standard photolithographic patterning techniques. The encoder circuit 24 has an input 26 for receiving a 6-bit binary digital audio signal. The encoder circuit is made up of a unipolar logic gate array. Alternatively, offset or two's-complement types of logic may be used, as described in PCT/GB96/00736.

Figure 19:
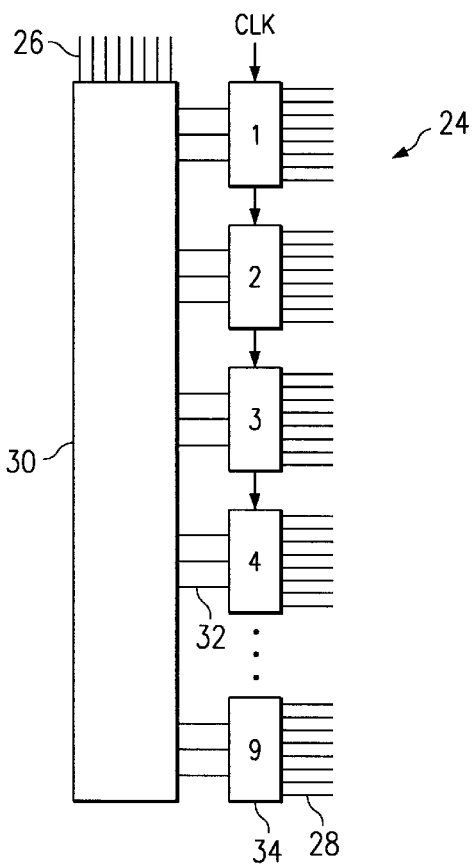
FIG. 19 shows structure of the encoder circuit of FIG. 17 including sub-modules for converting 3-bit binary digital input into a 7-channel unary digital output.

FIG. 19 shows the structure of the encoder circuit 24 in more detail. The six tracks of the 6-bit binary digital input 26 are connected to a binary-to-binary converter 30 which converts the 6-bit binary digital input into nine 3-bit binary digital outputs 32. In making this conversion, the three least significant bits form one of the 3-bit outputs. The 4th least significant bit forms another of the 3-bit outputs, the 5th least significant bit forms a further two of the 3-bit outputs and the 6th least significant bit forms the remaining four 3-bit outputs. The nine 3-bit outputs are connected to respective encoder sub-modules in the form of unipolar 3-bit binary-to-unary converters 34, each for providing seven unary digits of output which are supplied to respective rows of the transducers in the track groups 28 already mentioned with reference to FIG. 17 and FIG. 18. The converters 34 are clocked by a clock signal CLK to ensure synchronisation of their outputs. The clock signal may be generated internally by the transducer module or may be received as part of, or derived from, the input signal 26.

The encoder circuit 24 is configured so that in use the currently active transducers, i.e. those connected to outputs of the encoder circuit that are carrying drive signals, are clustered generally in a cohesive active area, preferably an area in a mid-region of the array. As the sound level is increased, the encoder circuit is configured to select for driving previously inactive transducers lying adjacent the previously active area, so as to maintain the generally cohesive nature of the active area. Similarly, as the sound level is decreased, transducers are removed from the edge of the previously active area. It will however be understood that a proportion of the active transducers, preferably a small proportion, may be physically remote from the active transducers that collectively form a generally cohesive area.

Figure 20:
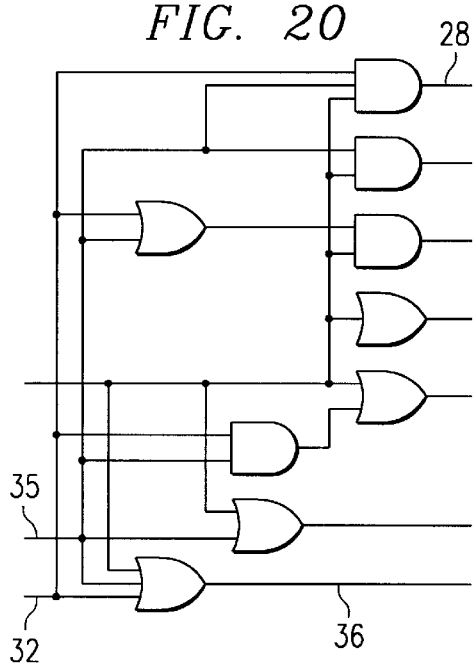
FIG. 20 shows logic gates of one of the sub-modules shown in FIG. 19.

FIG. 20 shows the logic gate structure of one of the unipolar 3-bit binary-to-unary converters 34. The other converters 34 are the same. There are three input lines 35 for the 3-bit binary digital input, the input lines 35 being collectively referred to using the reference numeral 32 in FIG. 19. The upper one of the illustrated three input lines is for the most significant bit of the 3-bit input. The lower one of the three illustrated input lines is for the least significant of the three bits. The seven unary output lines 36 collectively form one of the groups 28 illustrated in FIG. 19, and also FIG. 17 and FIG. 18.

With a transducer footprint area of 1-by-1 centimeters, the above-described module with 63, i.e. $2^6-1$, transducers can be made from a single pair of 5 inch wafers. With a footprint of 2.5 millimeters square a module with $2^8-1$ transducers can be made using a pair of 5 inch wafers. In some embodiments, each module will have $2^n$, $2^{n-1}$ or $2^n-1$ transducers to be compatible with the unary reproduction of a conventional n-bit binary digital audio signal. In other embodiments, different numbers of transducers may be provided through the use of power control as described in PCT/GB96/00736.

By using conventional silicon micromachining and other conventional silicon processing techniques, it is possible to vary the area of each transducer through several orders of magnitude without changing the basic design. For example, the individual length dimension of each transducer could be 10 millimeters or 0.1 millimeters. With an individual transducer area of 0.1-by-0.1 millimeter, a transducer array of $2^{16}-1$ output transducers would occupy a total area of 2.2 cm-by-3 cm for example. This scalability, together with the highly reproducible nature of silicon technology, means that almost any practically desirable number of output transducers can be integrated into a single module of a pre-defined total area.

In addition it is possible to incorporate all the drive circuitry in the panels, more preferably with all or substantially all of the drive circuitry in only one of the two panels, with the other of the panels having a single conductive layer for all transducers that is electrically connected to earth.

As well as semiconductor materials, insulator materials such as sapphire could also be used for the panels. For example, a sapphire lower panel could be used in combination with a silicon upper panel with the drive circuitry primarily incorporated in the upper panel.

For smaller transducers, photolithographic techniques common for integrated circuits could be employed instead of the large scale micro-machining techniques described above. Moreover, instead of two wafers, the loudspeaker module could be manufactured from a single wafer with the space between the upper and lower panels being formed by selective etching.

One such embodiment is now described with reference to FIG. 21A to FIG. 21F which show in sequence fabrication steps of an acoustic output transducer used in another design of unary loudspeaker, by schematic illustration of cross-sections through a wafer during various stages of processing. The formation of only one transducer element is illustrated, but it will be understood that a large two-dimensional array of similar transducers will typically be fabricated.

Figure 21A:
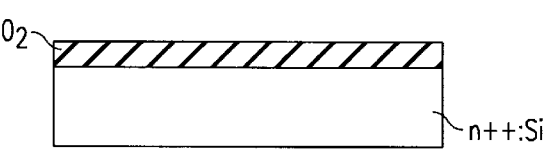
FIGS. 21A to 21F show schematically in section an area of a silicon wafer during processing to form an acoustic output transducer for use in a different kind of unary loudspeaker.

FIG. 21A shows a conducting n++ Silicon substrate on which has been deposited a sacrificial layer of silicon dioxide.

Figure 21B:
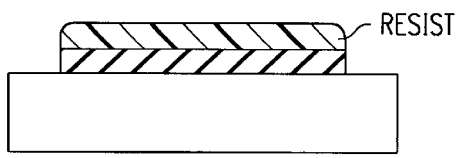

FIG. 21B shows the structure of FIG. 21A on which has been patterned a layer of resist after etching to remove portions of the sacrificial oxide layer that are distributed around an area which is ultimately to form the diaphragm of a single transducer element.

Figure 21C:
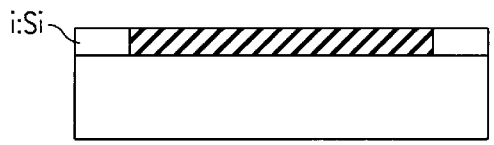

FIG. 21C shows the structure of FIG. 21B after deposition of intrinsic silicon, which is an insulating material, and subsequent removal of the resist shown in FIG. 21B. The intrinsic silicon is deposited to form a ring of insulating pillars (when viewed from above) around an area which will form the diaphragm in the finished device.

Figure 21D:
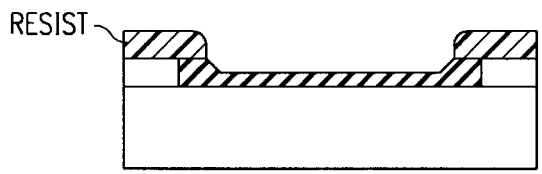

FIG. 21D shows the structure of FIG. 21C after patterning with a further layer of resist, the resist leaving an open area somewhat smaller than and concentric with the enclosed area defined by the intrinsic silicon pillars, and subsequent etching to remove an upper part of the area of silicon dioxide that remains exposed, thereby to thin the silicon dioxide layer over this area.

Figure 21E:
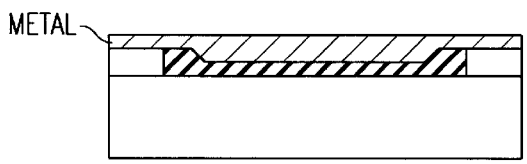

FIG. 21E shows the structure of FIG. 21D after removal of the resist and deposition of a thick layer of metal covering the thinned area of silicon dioxide and extending laterally to cover the intrinsic silicon pillars.

Figure 21F:
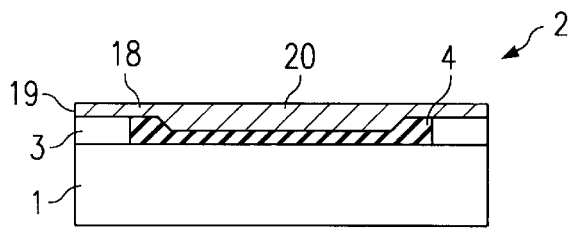

FIG. 21F shows the structure of FIG. 21E after removal of the remaining parts of the sacrificial silicon dioxide layer to form the final structure of the transducer element (except for structure associated with subsequent metallisation, passivation etc. which is not shown).

FIG. 21F is additionally provided with reference numerals corresponding to those used in FIG. 16 and showing elements of the transducer. The no substrate forms a lower panel 1 which is conductive so that provision of a separate conductive layer is not necessary. The metal layer forms the upper panel 2. The intrinsic silicon pillars form the insulating material 3. A gap 4 is formed by the space left after etching away the remainder of the sacrificial silicon dioxide layer and is bounded on its upper side by the metal layer and on its lower side by the substrate. The metal layer has a thicker central area forming the diaphragm portion 20, regions laterally coextensive with the pillars 3 which form the peripheral portion 19 and a ring-shaped region lying radially adjacent and within the pillars 3 which form the resilient support portion 18 of the transducer.

It will be understood that although the above description of FIG. 17 and FIG. 18 was made with reference to a transducer according to FIG. 16, the description of these figures applies also to a transducer according to FIG. 21F which can be used in a module structure as shown in FIG. 17, although much larger numbers of transducers would be fabricated in a typical example of transducers according to FIG. 21F.

Transducer drive circuits may be integrated circuits formed in the semiconductor material of the transducer array using conventional processing techniques. This is possible with an array made of transducers as described with reference to FIG. 16 or FIG. 21F. Moreover, the transducer drive circuits may be distributed among the transducer elements, laterally adjacent the array, or partly among the transducer elements and partly laterally adjacent the array.

Although one specific implementation in silicon using photolithographic techniques has been described, it will be understood that considerable variation is possible. For example the substrate 1 may include an intrinsic layer on its upper side to prevent physical contact by the metal layer causing an electrical short of the capacitor. The substrate may also be insulating rather than conductive and have a conductive layer, such as a metal layer on its underside for forming one plate of the parallel plate capacitor. Moreover, the upper layer 2 may include silicon, silicon dioxide or silicon nitride as well as, or instead of, metal. Many other variations will be apparent.

Further, as an alternative to silicon technology, GaAs technology could be used. For example, the lower side 5 of the upper panel 2 and the upper side 6 of the lower panel could be the lower and upper surfaces of respective GaAlAs epitaxial layers, with the gap 4 being formed by selective lateral dry etching of an intervening GaAs layer using $CCl_2F_2$. Details of this etch process are given in an article by Martin Walther et al in Journal of Applied Physics, volume 72, 2069 (1992). In this case, it will be understood that references to upper and lower panels will be references to upper and lower portions of semiconductor material originating in the same wafer, with the lower portion being lower epitaxial layers, or the substrate itself, and the upper portion being etched upper parts formed from epitaxial layers.

Some common design constraints for the integrated loudspeaker module of many embodiments will be the total area permitted for the transducer array, the number of bits of resolution (from which follows the number of transducers required) and the output power capability. The shape of the integrated module may also vary depending on the application. For example, for a hand-held video telephone, the transducer modules may be rectangular strips for arrangement on adjacent sides of a display panel.

It will be understood that although it will be convenient and desirable in most cases to manufacture the transducers in integrated modules. However, it is also possible to manufacture the transducers singly should this ever be required. In a typical application, a loudspeaker will be made from one integrated module or a relatively small plural number of modules, for example between 2 and 10 modules.

Figure 22:
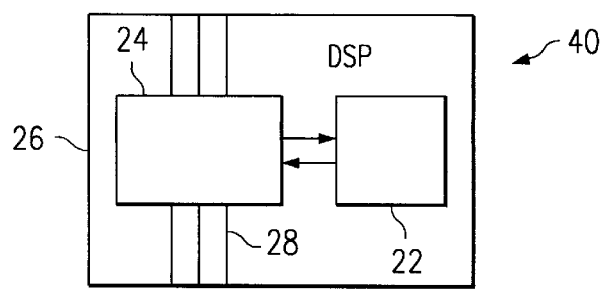
FIG. 22 shows a digital signal processor comprising digital-to-unary converter and pulse shaping circuitry used in a further unary loudspeaker design.

FIG. 22 shows schematically a digital signal processor 40 used in an alternative embodiment arranged to one side of the transducer array. The digital signal processor forms a part of the drive circuit including binary-to-unary encoding circuitry 24 arranged to receive a binary digital input 26 and pulse shaping circuitry 22 arranged to modify the shape of each drive pulse prior to routing of that pulse to one of the drive signal outputs 28.

To perform binary-to-unary encoding, the digital signal processor 40 is loaded with a binary-to-unary conversion routine for determining which drive circuit outputs receive drive pulses responsive to the binary digital audio signal. The conversion routine can be based on a look-up table or may incorporate an algorithm. In this regard, it is noted that no addressing in a conventional sense is required for the unary outputs, because each output has equal significance.

To perform the pulse shaping function, the digital signal processor 40 is loaded with a pre-determined non-linear response function or characteristic of the transducers, and is operable to compute the output pulse shapes of the drive pulses based on this response.

It will be understood that separate digital signal processors could be used for encoding and pulse shaping. Further, only one of these processing functions could be performed with a digital signal processor, the other being implemented in dedicated integrated circuits.

Figure 23B:
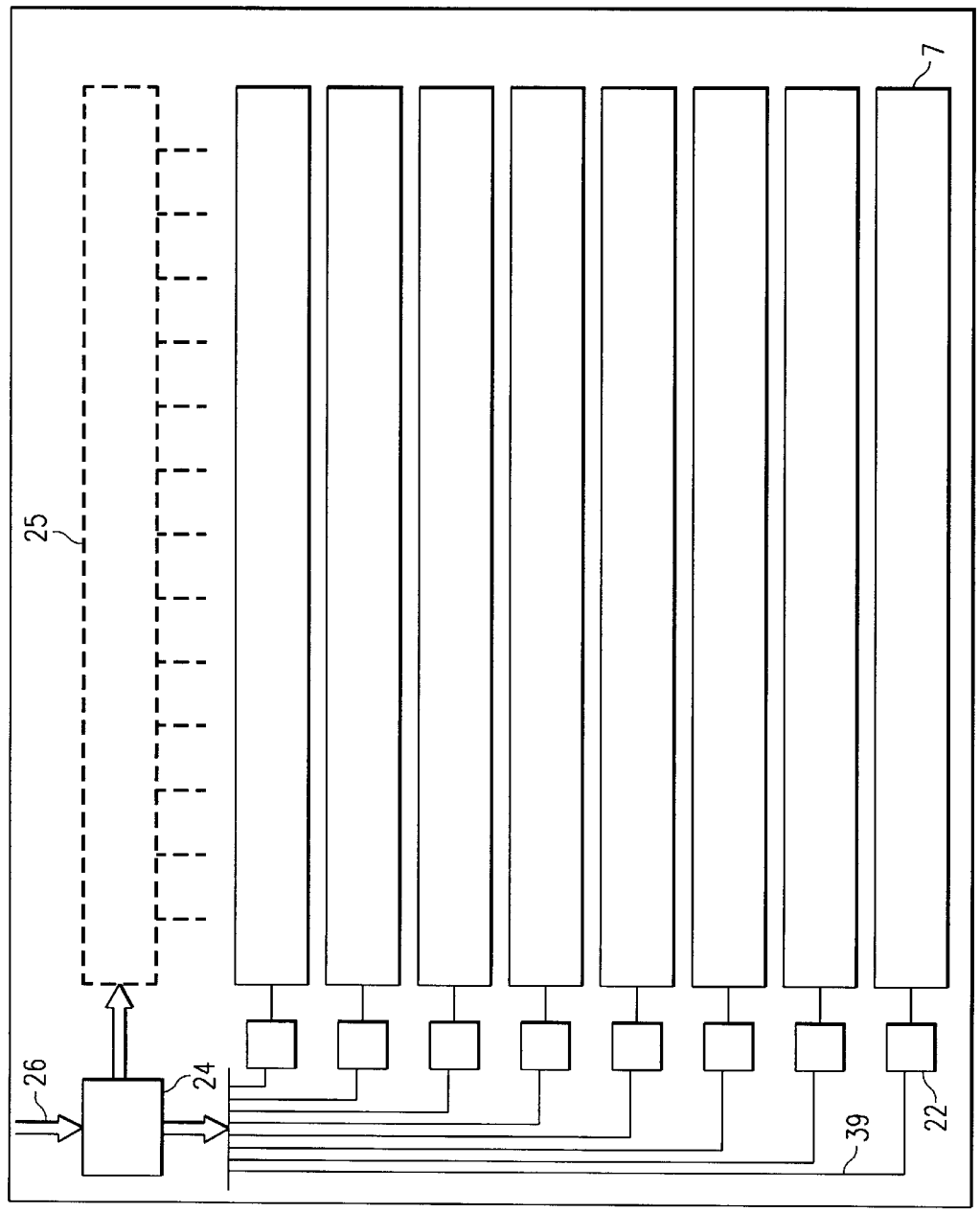

FIG. 23A and FIG. 23B show an integrated module according to another unary loudspeaker design which uses alternative drive circuitry. Illustrated is an 8-by-8 array of 64 acoustic output transducers. FIG. 23A shows an upper part of the module with circular diaphragms and associated upper conductive layers 9, whereas FIG. 23B shows a lower part of the module with lower conductive layers 7. The arrangement of digital audio signal input 26, encoder 24, and the general layout of the transducers, will be understood by reference to the above-described embodiments. The present embodiment may be based on transducers according to FIG. 16 or FIG. 21F.

As shown in FIG. 23A, in this embodiment, the drive circuitry includes an additional component in the form of a column select circuit 25 connected to receive address data from the encoder circuit 24 which may be a microprocessor, more especially a digital signal processor. Selection lines 38 connect the column select circuit 25 with the upper conductive layers 9 of the transducers. Illustrated are eight separate selection lines 38 to the upper conductive layer 9 of each individual transducer of columns 1 and 8, four separate selection lines 38 to the upper conductive layers 9 of adjacent pairs of transducers in columns 2 and 7, two selection lines 38 to the upper conductive layers 9 of two groups of four transducers in columns 3 and 6, and a single selection line 38 to the upper conductive layers 9 of all the transducers in each of columns 4 and 5. With this arrangement, in the absence of a column select signal to any given upper conductive layer, that layer is open circuited so that it will float to follow the facing lower conductive layer, thereby suppressing any voltage differences which would tend to cause diaphragm motion.

As shown in FIG. 23B, the module of this embodiment includes one pulse shaping circuit 22 for each row of transducers. The pulse shaping circuits 22 are each individually connected to an output of the encoder circuit 24 by a connection line 39. The lower conductive layers 7 of the transducers of each row are electrically connected to each other, as illustrated by an elongate rectangular area in FIG. 23B, and to the output of the pulse shaping circuit 22 for the row concerned.

In this way, a given individual transducer element is driven by an electrostatic driving force to output sound only when there is an appropriate combination of a drive signal to its row through the relevant one of the pulse shaping circuits 22 and a select signal to its upper conductive layer 7.

It will be understood that the drive capability for each row signal output from the associated pulse shaping circuit 22 needs to be sufficient to drive the maximum load presented by the transducers of that row.

With the cross-point addressing scheme of the present embodiment, in comparison with the drive circuit arrangement shown in FIG. 17 and FIG. 18, there is the advantage that the number of pulse shaping circuits is reduced from one per transducer to one per row of transducers. Further, the use of separate column and row select lines allows the total number of interconnect lines over the module to be reduced by connecting together the upper conductive layers of groups of transducers. In the illustrated arrangement, these connections are in 16 groups of 1, 8 groups of 2, 4 groups of 4 and 2 groups of 8 with each group extending in the columwise direction. However, any desired sub-division of groups may be chosen. For example, there could be one column-wise extending group of each of 1, 2, 4, 8, 16 and 32 transducers in an array of 63 transducers.

In this respect it will be relevant to consider that to avoid transient problems, analogous to those present in binary schemes, the grouping needs to be such that in use incremental changes in the number of transducers to be driven can be effected across a broad range of total number of active transducers without having to switch on and off a significant proportion of the active transducers. For this reason it is preferred in the present embodiment that the encoder 24 is implemented as a digital signal processor so that the module can be driven having regard to which individual transducers are active to minimise transients between sampling intervals.

It will thus be understood that the present embodiment will have a number individually drivable transducers less than the total number of transducers of the array, but substantially more than the number of an equivalent binary driven transducer array. This provides an interim subbinary design of drive circuitry which requires less connection lines than pure unary drive circuitry in which each transducer has its own connection lines so that it is fully independently drivable, but has significantly more connection lines than a binary drive circuit and is thus drivable without the major drive transients that occur with a binary drive in which an array of $2^n$ transducers is subdivided into only n independently drivable transducer blocks of 1, 2, 4, 8 and $2^{n-1}$ transducers. Preferably, in a transducer array according to the present embodiment comprising at least $2^n$ transducers, the largest block of collectively driven transducers will comprise no more than $2^{n-3}$, more preferably $2^{n-4}$ transducers. This compares with a binary driven transducer array of $2^n$ transducers which the largest block would have $2^{n-1}$ collectively driven transducers. Moreover, for the same reason, it is preferable if there are a significant number of smaller blocks of transducers, for example a significant number of individually drivable transducers and/or transducer pairs.

Although the loudspeaker design has been described above in terms of an embodiment for receiving a 6-bit binary digital audio signal, it will be understood that in practice an integrated transducer module will often be more preferably suitable for processing 8-bit, 10-bit, 12-bit or 16-bit binary digital audio signals. The 6-bit design described above is readily scalable to provide such higher audio resolution, as is needed for a reasonable reproduction quality of content bearing speech or musical signals. In fact, description of a 6-bit embodiment is made herein primarily to assist clarity by avoiding the presence of much higher numbers of transducers which are less amenable to simple graphical representation and should not be taken as an indication that this is an optimum or typical number of transducers for an integrated digital loudspeaker module.

What is claimed is:

1. A method of coding a digital audio signal, the method comprising:
    (a) receiving a set of digital audio signal data comprising a succession of absolute amplitude values associated with respective sample periods of the digital audio signal; and
    (b) calculating the numerical difference between adjacent ones of the absolute amplitude values, thereby to convert the succession of absolute amplitude values into a corresponding succession of difference amplitude values, wherein the absolute amplitude values are integers of positive or zero value, representing the number of speaker elements of a unary digital loudspeaker that are to be active in the sample period concerned, and the difference amplitude values are integers of positive, negative or zero value, representing the change in the number of speaker elements of a unary digital loudspeaker that are to be active in the sample period concerned relative to the immediately preceding sample period.

2. A method according to claim 1, wherein the difference amplitude values are represented by a sign bit and a plurality of data bits.

3. A method according to claim 2, further comprising:
    (c) dividing each difference amplitude value by a predetermined volume value, thereby to obtain a succession of reduced difference amplitude values, the predetermined volume value reflecting a desired average number of speaker elements of a unary digital loudspeaker that are to be active over the sample periods of the set of digital audio signal data.

4. A method according to claim 3, wherein the reduced difference amplitude values are integers of positive, negative or zero value, representing a fraction of the change in the number of speaker elements of a unary digital loudspeaker that are to be active in the sample period concerned relative to the immediately preceding sample period.

5. A method according to claim 4, wherein the set of digital audio signal data is received with the succession of absolute amplitude values in binary form, the absolute amplitude values then being converted from binary to unary form prior to calculating the numerical difference between adjacent ones of the absolute amplitude values.

6. A method according to claim 4, wherein the absolute amplitude values, once converted from binary to unary form, are represented by a plurality of data bits, with the absolute amplitude value for each sample corresponding to the number of data bits which are set in each plurality of data bits.

7. A method according to claim 6, wherein the data bits of each sample which are set are grouped into a continuous pulse, the width of which represents the number of speaker elements of a unary digital loudspeaker that are to be active in the sample period concerned.

8. A digital audio product comprising a header containing a product identifier, and at least one audio data block containing a succession of difference amplitude values, each difference amplitude value being an integer of positive, negative or zero value, representing the change in the number of speaker elements of a unary digital loudspeaker that are to be active in one sample period relative to the immediately preceding sample period.

9. A digital audio product according to claim 8, wherein the or each audio data block further contains a predetermined volume value by which each of the difference amplitude values in the associated data block are to be multiplied in an initial phase of decompression of the difference amplitude values.

10. A data carrier including a recording medium in which is stored a digital audio product according to 9.

11. A transmission medium on which is borne a signal communicating a digital audio product according to claim 9.

12. A transmission medium according to claim 11, wherein the transmission medium is air, an electrical cable or an optical fibre.

13. An encoder for compressing a unary digital audio signal containing a succession of amplitude values, each representing sound amplitude during a sample period, the encoder comprising:
    (a) an encoder input for receiving a unary digital audio signal;
    (b) a subtractor having a first input connected to receive the unary digital audio signal from the encoder input;
    (c) a delay line connected to receive the unary digital audio signal from the encoder input and to relay that signal after a delay of one sample period to a second input of the subtractor; and
    (d) an encoder output connected to receive a compressed digital audio signal from the subtractor containing a succession of difference amplitude values, each representing a numerical difference between ones of the amplitude values in the unary digital audio signal received at the encoder input.

14. An encoder according to claim 13, further comprising:
    (e) a divider connected between the subtractor and the encoder output and operable to divide each difference amplitude value received from the subtractor by a defined volume value.

15. An encoder according to claim 14, further comprising:
(f) an external input connected to allow external definition of the volume value supplied to the divider.

16. An encoder according to claim 14, further comprising:
(f) a computational unit arranged to receive a succession of amplitude values, each representing sound amplitude during a sample period, and to compute therefrom an average amplitude value, and, in turn, a value for the volume value, the computational unit having an output connected to the divider for supplying to the divider with the volume value thus computed.

17. A transmitter, wireless transmitter or recording device comprising an encoder according to claim 15.

18. A method of decoding a compressed unary digital audio signal to generate a decoded signal, the method comprising:
(a) receiving a succession of difference amplitude values, each representing a difference in sound amplitude between sample periods; and
(b) adding to successive ones of the difference amplitude values an amplitude value derived from preceding ones of the difference amplitude values and a start value, thereby to convert the succession of difference amplitude values into a corresponding succession of amplitude values, each representing sound amplitude during a sample period of a unary digital audio signal.

19. A method according to claim 18, wherein the difference amplitude values are integers of positive, negative or zero value, the start value is zero, and the succession of difference amplitude values initiates with a amplitude value that represents sound amplitude during an initial sample period of the unary digital audio signal.

20. A method according to claim 19, wherein the difference amplitude values are represented by a sign bit and a plurality of data bits, with the difference amplitude value for each sample corresponding to the number of data bits which are set in each plurality of data bits.

21. A method according to claim 20, wherein the data bits of each sample which are set are grouped into a continuous pulse in the compressed signal, the width of which represents the change in the number of active speaker elements of a unary digital loudspeaker in comparison to the immediately preceding sample period.

22. A method according to claim 20, wherein the amplitude values in the decoded signal are represented by a plurality of data bits, with the amplitude value for each sample corresponding to the number of data bits which are set in each plurality of data bits.

23. A method according to claim 22, wherein the data bits of each sample which are set in the decoded signal are grouped into a continuous pulse, the width of which represents the number of speaker elements of a unary digital loudspeaker that are to be active in the sample period concerned.

24. A method according to claim 23, further comprising:
receiving a volume value associated with said succession of difference amplitude values and multiplying each of the difference amplitude values by the volume value prior to a said adding.

25. A decoder for de-compressing a compressed digital audio signal, the decoder comprising:
(a) a decoder input for receiving a digital audio signal containing a succession of difference amplitude values, each representing a difference in sound amplitude between sample periods;
(b) a logic unit having a first input connected to receive the digital audio signal from the decoder input and a second input connected by a feedback path to an output of the logic unit so that the logic unit is operative to increment or decrement the positive amplitude value output by the logic unit in an immediately preceding sample period by the positive or negative difference amplitude value received at its first input; and
(c) a decoder output connected to the output of the logic unit, thereby to output a succession of amplitude values representing sound amplitudes during respective sample periods of a unary digital audio signal, as reconstituted by the logic unit.

26. A decoder according to claim 25, further comprising:
(d) a multiplier arranged between the decoder input and the logic unit, and operable to multiply each difference amplitude value by a volume value supplied to the decoder as part of the compressed digital audio signal.

27. A decoder according to claim 26, further comprising a further multiplier arranged between the logic unit and the decoder output, and operable to multiply each amplitude value by an amount defined by an external actuation signal supplied to the further multiplier.

28. A receiver or wireless receiver comprising a decoder according to claim 27.

29. An audio reproduction system comprising a decoder according to claim 27 in combination with a drive circuit and a unary loudspeaker.

* * * * *

UNITED STATES PATENT AND TRADEMARK OFFICE
CERTIFICATE OF CORRECTION

PATENT NO.     : 6,711,546 B1
DATED          : March 23, 2004
INVENTOR(S)    : David R. Thomas It is certified that error appears in the above-identified patent and that said Letters Patent is hereby corrected as shown below:

<u>Title page,</u>
Insert Item:
-- [73]   Assignee:     Texas Instruments Incorporated,
                        Dallas, TX (US) --

Signed and Sealed this

Twenty-fifth Day of May, 2004

JON W. DUDAS
*Acting Director of the United States Patent and Trademark Office*